United States Patent
Chen et al.

(10) Patent No.: US 12,317,449 B2
(45) Date of Patent: May 27, 2025

(54) STRUCTURE FOR DETECTION AND COLLECTION OF LEAKED COOLANT

(71) Applicant: Quanta Computer Inc., Taoyuan (TW)

(72) Inventors: Yi-Chieh Chen, Taoyuan (TW);
Yueh-Chang Wu, Taoyuan (TW);
Yan-Kuei Chen, Taoyuan (TW);
Yu-Hung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 217 days.

(21) Appl. No.: 17/816,889

(22) Filed: Aug. 2, 2022

(65) Prior Publication Data
US 2024/0049425 A1    Feb. 8, 2024

(51) Int. Cl.
*H05K 7/20*    (2006.01)
*G01M 3/40*    (2006.01)
*G06F 1/20*    (2006.01)

(52) U.S. Cl.
CPC .......... *H05K 7/20272* (2013.01); *G01M 3/40* (2013.01); *G06F 1/206* (2013.01); *H05K 7/20254* (2013.01)

(58) Field of Classification Search
CPC ........... H05K 7/20272; H05K 7/20254; H05K 7/20781; H05K 7/20772; H05K 7/20236; H05K 7/20809; G01M 3/40; G06F 1/20; G06F 1/206
See application file for complete search history.

(56) References Cited

U.S. PATENT DOCUMENTS

| | | | | |
|---|---|---|---|---|
| 5,156,047 A | * | 10/1992 | Tuma | G01F 23/2963 73/304 C |
| 5,339,676 A | * | 8/1994 | Johnson | G01M 3/02 73/863.52 |
| 10,638,645 B1 | | 4/2020 | Moen et al. | |
| 11,262,247 B1 | * | 3/2022 | Cardwell | G01K 1/143 |
| 2008/0055112 A1 | * | 3/2008 | McGinty | A47L 15/4212 340/870.16 |

(Continued)

FOREIGN PATENT DOCUMENTS

| | | |
|---|---|---|
| CN | 101813962 A | 8/2010 |
| CN | 206431562 U | 8/2017 |

(Continued)

OTHER PUBLICATIONS

Chen, Yanzhi; Deng, Zhiming, "Discharge structure and notebook computer utilizing same", Aug. 25, 2010, Inventec Corp, Description (Espacenet Machine Translation of CN 101813962 A) (Year: 2010).*

(Continued)

*Primary Examiner* — Stephen S Sul
*Assistant Examiner* — Jeffrey Francis Stoll
(74) *Attorney, Agent, or Firm* — NIXON PEABODY LLP

(57) ABSTRACT

A structure for protecting an electronic component from coolant leaking from a liquid cooling system is disclosed. The liquid cooling system has a manifold collecting and supplying coolant to a cold plate via inlet and outlet tubes. The cold plate is mounted over a heat-generating component on a circuit board. The structure includes a drip tray having a top surface and a length approximately the distance between the manifold and the cold plate. The drip tray includes a trough for collection of leaking coolant. The tray is inserted between the circuit board and the inlet and outlet tubes.

16 Claims, 5 Drawing Sheets

(56) References Cited

U.S. PATENT DOCUMENTS

| | | | |
|---|---|---|---|
| 2008/0179962 A1* | 7/2008 | Wood | G01M 3/16 |
| | | | 307/98 |
| 2009/0134889 A1* | 5/2009 | Gunsay | A01G 25/167 |
| | | | 324/694 |
| 2014/0071616 A1* | 3/2014 | Watanabe | H05K 7/20772 |
| | | | 361/679.47 |
| 2015/0131228 A1* | 5/2015 | Ishikawa | H05K 7/20827 |
| | | | 361/699 |
| 2016/0270259 A1* | 9/2016 | Chainer | H05K 7/20272 |
| 2016/0270267 A1 | 9/2016 | Chainer et al. | |
| 2017/0172372 A1* | 6/2017 | Chen | A47L 15/4212 |
| 2017/0177007 A1* | 6/2017 | Shelnutt | H05K 7/20736 |
| 2017/0181321 A1* | 6/2017 | Shelnutt | H05K 7/20836 |
| 2017/0181329 A1* | 6/2017 | Shelnutt | H05K 7/20781 |
| 2017/0278372 A1* | 9/2017 | Doughty | G01F 1/28 |
| 2021/0385970 A1* | 12/2021 | Su | G01M 3/3263 |
| 2023/0063710 A1* | 3/2023 | Gao | H05K 7/20509 |
| 2023/0171921 A1* | 6/2023 | Field | H05K 7/20272 |
| | | | 700/300 |

FOREIGN PATENT DOCUMENTS

| | | |
|---|---|---|
| JP | S60181665 U | 12/1985 |
| JP | S6242044 U | 3/1987 |
| JP | H08152152 A | 6/1996 |
| JP | H0972943 A | 3/1997 |
| JP | H0984349 A | 3/1997 |
| JP | 2002251985 A | 9/2002 |
| JP | 2006066669 A | 3/2006 |
| JP | 2014053504 A | 3/2014 |
| JP | 2019133631 A | 8/2019 |

OTHER PUBLICATIONS

Deng, Kaijun et al., "A leak protection device for liquid cooling system in data center server", Aug. 22, 2017, Guangzhou Inst Energy Conversion Cas, Description (Espacenet Machine Translation of CN 206431562 U) (Year: 2017).*

Osoyoo.com, "Basic Lesson—Water Sensor", Sep. 27, 2017, Osoyoo, https://osoyoo.com/2017/09/27/arduino-lesson-water-sensor/ (Year: 2017).*

TW Office Action for Application No. 111139742 mailed Jun. 1, 2023, w/ First Office Action Summary.

JP Office Action for Application No. 2023039555, mailed May 14, 2024, w/ First Office Action Summary, 11 pp.

JP Office Action for Application No. 2023039555, mailed Oct. 15, 2024, w/ Second Office Action Summary, 7 pp.

* cited by examiner

STRUCTURE FOR DETECTION AND COLLECTION OF LEAKED COOLANT

TECHNICAL FIELD

The present disclosure relates generally to a liquid cooling system for a computer system. More particularly, aspects of this disclosure relate to a liquid cooling system with a collection structure to facilitate collection and detection of leaked coolant.

BACKGROUND

Computer devices, such as servers, include numerous electronic components that are powered by a common power supply. Servers generate an enormous amount of heat due to the operation of internal heat-generating electrical devices such as controllers, processors, and memory. Overheating from the inefficient removal of such heat has the potential to shut down or impede the operation of such devices. Thus, current servers are designed to rely on air flow through the interior of the server to carry away heat generated from heat-generating electrical components. Servers often include various heat sinks that are attached to the electronic components such as processing units. Heat sinks absorb the heat from the electronic components, thus transferring the heat away from the components. The heat from heat sinks must be vented away from the server by a fan system.

Computing demands for computer systems, such as servers, continually grow. Important components such as the CPU, GPUs, and other high-performance computing (HPC) components that have thermal design power (TDP) and low temperature specifications requirements are critical. Improvements in these components mandate using more efficient thermal solutions than known air cooling. For example, currently available high-speed CPUs with high TDP and low temperature spec need to use a liquid cooling solution for high ambient temperature requirements. Due to the improvement of high-performance systems, the amount of heat that needs to be removed becomes higher with each new generation of electronic components. The evolution of the expected workloads of standard servers to stay productive has fundamentally changed requiring constant evaluation of cooling systems. With the advent of more powerful components, traditional air cooling, in combination with fan systems, is inadequate to sufficiently remove heat generated by newer generation components. Due to higher densities, specific heat capacities, and thermal conductivities, liquids are generally much better cooling agents than, for example, air.

Water has a heat-carrying capacity 3,500 times (given a specific volume of water flow over a hot component–the volumetric flow rate) higher than air and a thermal conductivity 24 times greater. This makes liquid cooling far more efficient than air cooling in environments such as computer systems where the component density of the environment starts to increase. Thus, liquid cooling is the accepted solution for rapid heat removal due to the superior thermal performance from liquids. Liquid cooling is more effective than known air cooling in transporting heat away from a heat source to a radiator, and allows heat removal from critical parts without noise pollution.

In rack level liquid cooling system designs, the cooling liquid system includes a closed loop cooling component and an open loop cooling component to facilitate heat exchange from devices such as servers in the rack. Closed loop liquid cooling systems use heat exchange to cool hot water carrying heat from the servers. Heat is then removed from the hot water via an open loop system that uses a radiator in conjunction with a fan wall. An inlet tube carries coolant liquid to a cold plate over a heat-generating electrical component, such as a processor chip, in the server. The cold plate has a network of internal conduits that circulate the coolant internally in the cold plate. Each processor in a server may have a dedicated cold plate or share a cold plate with another processor. Heat generated by the processor is transferred to the cold plate and is in turn transferred to the coolant liquid circulating through the cold plate. An outlet tube carries heated liquid away from the cold plate. A heat exchanger transfers heat from the heated liquid by being cooled by a fan wall. The now cooled coolant is then recirculated to the inlet tube back to the cold plate. However, when using a liquid cooling solution, designers need to consider protection of components in the server against potential coolant leaks.

FIG. 1 is a top view of a prior art server 10 having cold plates installed on components. The server 10 includes a chassis 12 that has a circuit board 14 mounting components such as dual in line memory modules 16 on the side of processor chips (not shown). In this example, two cold plates 22 and 24 are mounted over heat-generating electrical components, such as the processors, to transfer heat away from the processors.

The coolant is circulated internally in both cold plates 22 and 24 to carry away heat generated from the processors under the cold plates 22 and 24. The chassis 12 includes fluid connectors 26 and 28 that may be fluidly connected to a rack mounted heat exchanger. The fluid connector 26 supplies coolant to a manifold 30, while the connector 28 collects heated coolant from the manifold 30. Coolant received by the connector 26 is directed internally by the manifold 30 to the cold plate 22 via an inlet tube 32. An outlet tube 34 carries away the heated coolant from the cold plate 22 to the manifold 30. Similarly, coolant is supplied through in an inlet tube 36 to the cold plate 24. Heated coolant is removed from the cold plate 24 through an outlet tube 38 to the manifold 30. The tubes 32, 34, 36 and 38 run over a drip tray 40 that covers other electronic components on the circuit board 14. The drip tray 40 collects leaking fluid from any of the tubes 32, 34, 36 and 38. A cable type leak sensor 50 is strung out over the surface of the drip tray 40.

The leak sensor 50 has internal positive and negative poles that may be electrically connected by liquid contacting the exterior wall of the cable type leak sensor 50. There are two copper-plated coils (positive and negative) in the cable type leak sensor 50 that are combined with the non-woven fabric of the walls into the cable type leak sensor 50. When coolant contacting any part of the exterior wall of the cable type leak sensor 50 reaches at least 0.3 ml in volume, the coolant causes conduction between the two poles and changes the resistance of the cable type leak sensor 50, thus indicating a coolant leak. The change in resistance may trigger an alert from a controller that may then notify an end user to execute emergency leakage treatment to prevent damage from other key components in the system. However, the cable type leak sensor 50 must be of sufficient length to cover large areas of the drip tray 40. The cable type leak sensor 50 may not detect leaks in areas of the drip tray 40 where the cable is not located.

Thus, there is a need for a protection structure that allows for protection of components on a circuit board from coolant leakage. There is a need for a more effective and low-cost liquid cooling leakage solution that employs a more compact sensor than a cable type sensor. There is yet another need for a protection structure that funnels leaking coolant to a central area to facilitate leak detection.

SUMMARY

One disclosed example is a structure for protecting an electronic component from coolant leaking from a liquid cooling system. The liquid cooling system has a manifold collecting and supplying coolant to a cold plate via inlet and outlet tubes. The cold plate is mounted over a heat-generating component on a circuit board. The structure includes a drip tray having a top surface and a length approximately the distance between the manifold and the cold plate. The drip tray including a trough for collection of leaking coolant. The drip tray is insertable between the circuit board and the inlet and outlet tubes.

In another disclosed implementation of the example structure, the structure includes a coolant leak sensor on a bottom surface of the trough. In another disclosed implementation, the structure includes a porous layer positioned over the coolant leak sensor in the trough. In another disclosed implementation, the structure includes a hydrophobic coating applied over the top surface of the drip tray. In another disclosed implementation, the heat-generating component is a processor chip mounted on a circuit board. In another disclosed implementation, the processor chip is one of a graphic processing unit (GPU) chip or a central processing unit (CPU) chip. In another disclosed implementation, the drip tray includes sloped surfaces that each slope down from edges of the top surface and cause leaking coolant in contact with the drip tray to flow toward the trough. In another disclosed implementation, the top surface of the drip tray includes barriers to prevent flow of leaked coolant to the circuit board. In another disclosed implementation, the drip tray includes a plastic base member. In another disclosed implementation, the circuit board includes another cold plate fluidly coupled to the manifold, wherein the drip tray is interposed between the manifold and the other cold plate.

Another disclosed example is a computer device including a circuit board and a heat-generating component mounted on the circuit board. The computer device includes a manifold supplying and collecting coolant. A cold plate has a bottom contact surface that thermally contacts the heat-generating electrical component. A supply tube is fluidly connected to the cold plate to supply coolant from the manifold. A collection tube is fluidly connected to the cold plate and the manifold to collect coolant from the cold plate. A drip tray is inserted between the cold plate and the manifold. The drip tray has sloped surfaces that each slope down from edges to funnel leaked coolant to a trough. The drip tray is suspended between the circuit board and the supply and collection tubes.

In another disclosed implementation of the example computer device, the computer device includes a coolant leak sensor on a bottom surface of the trough. In another disclosed implementation, a porous layer is positioned over the coolant leak sensor in the trough. In another disclosed implementation, the drip tray has a top surface over which a hydrophobic coating is applied. In another disclosed implementation, the heat-generating component is a processor chip. In another disclosed implementation, the processor chip is one of a graphic processing unit (GPU) chip or a central processing unit (CPU) chip. In another disclosed implementation, the edges of the top surface of the drip tray include barriers to prevent flow of leaked coolant to the circuit board. In another disclosed implementation, the drip tray includes a plastic base member. In another disclosed implementation, the computer device includes another cold plate fluidly coupled to the manifold, wherein the drip tray is interposed between the manifold and the other cold plate.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
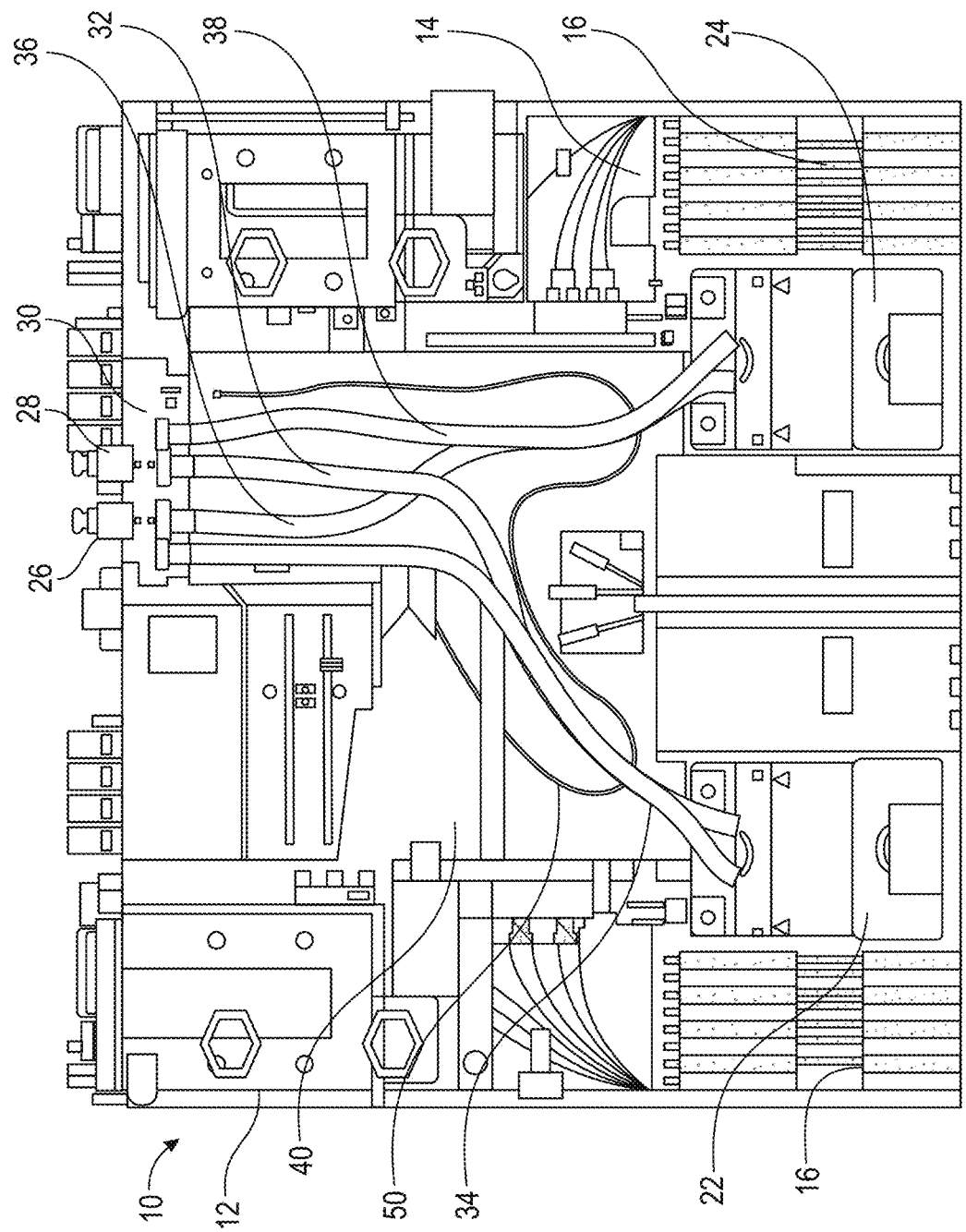
FIG. 1 is a top view of a prior art server having a liquid cooling system and a cable type leak detection sensor.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a structure for an interior liquid cooling system. A tray structure shielding components on a board underlies coolant tubes. The tray structure includes a trough that collects any leaking coolant. The trough has a sensor that allows detection of leaking coolant.

Figure 2A:
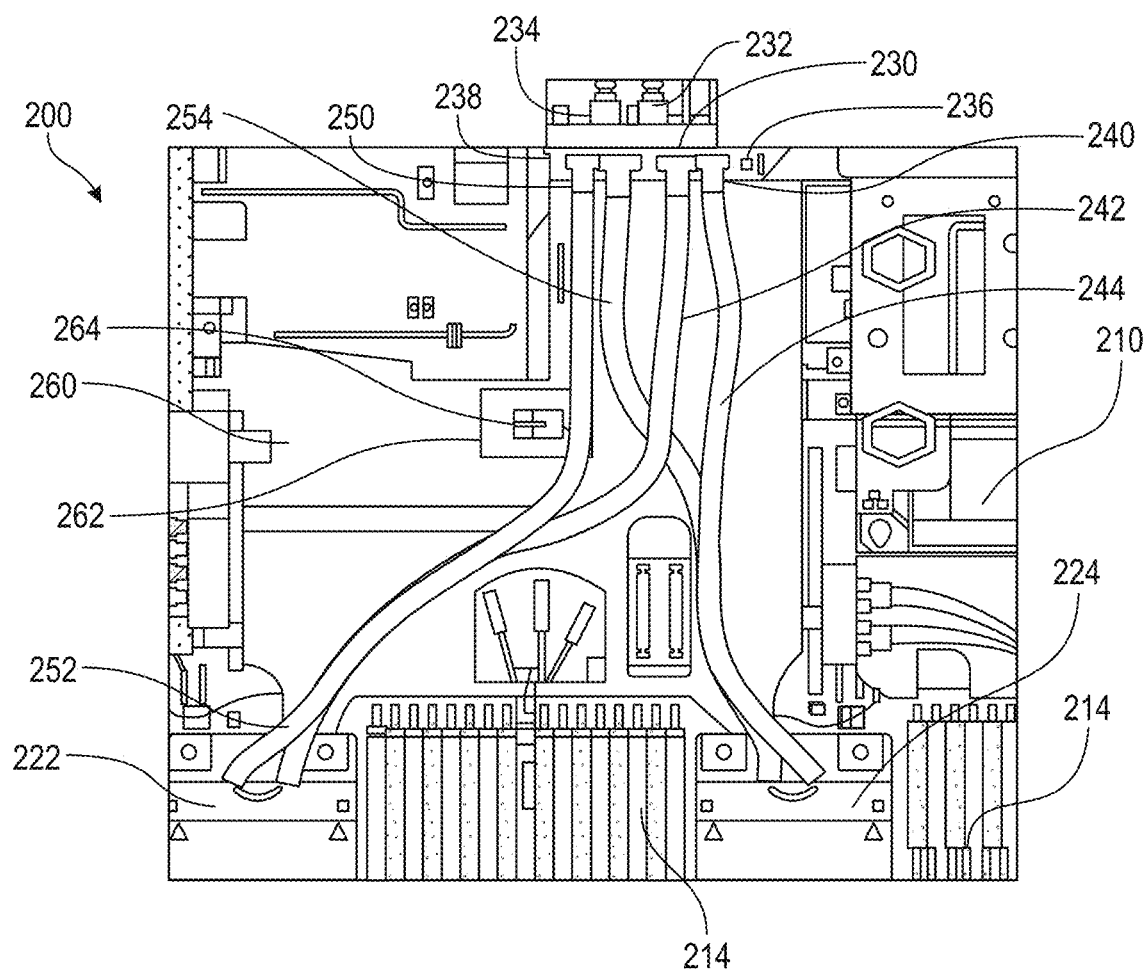
FIG. 2A is a top view of a computer system that includes the example leak collection and detection structure, according to certain aspects of the present disclosure.
Figure 2B:
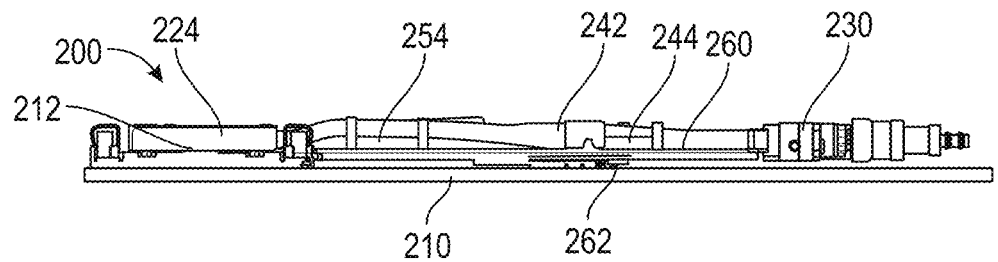
FIG. 2B is a side view of a computer system that includes the example leak collection and detection structure, according to certain aspects of the present disclosure.

FIG. 2A is a top view of a component such as a computer system that requires cooling with a closed loop liquid cooling system. In this example, the computer system is a server 200. FIG. 2B shows a side view of the server 200 with the liquid cooling system. The server 200 includes a circuit board 210 that mounts heat-generating electrical components such as processor chips 212. In this example, the processor chips 212 may be different types of processors such as central processing units (CPU)s or graphic processing units (GPU)s. A series of dual-in line memory modules (DIMMs) 214 are arranged near the processor chips 212. It is to be understood that there are other structures such as sockets, memory cards, and other components on the circuit board 210. Any number of processor chips or other types of chips may be mounted on the circuit board 210. It is to be understood that the principles described herein may be applied to any computer system, computer device, or other device that requires cooling of heat-generating components therein.

The cooling system includes a manifold 230 and two cold plates 222 and 224. Each of the cold plates 222 and 224 have a bottom surface in contact with the respective processor chip 212. The cold plates 222 and 224 are construed of thermally conductive material such as metal. Each of the cold plates 222 and 224 include internal conduits that circulate coolant to transfer heat from the respective processor chip 212.

The manifold 230 is connected to a main coolant supply connector 232 and a main coolant return connector 234. The connectors 232 and 234 are connected to coolant circulation hoses that may be part of a heat exchange system mounted on a rack that circulates coolant. The coolant supply connector 232 supplies coolant to a coolant supply manifold block 236. Returned coolant is collected by a coolant return manifold block 238 that is connected to the main coolant return connector 234. The manifold block 236 has connectors 240 that supply coolant to one end of a connected flexible supply tube 242 and one end of a connected flexible supply tube 244. The other ends of the tubes 242 and 244 are connected to the cold plates 222 and 224 respectively. Coolant is thus supplied via the tubes 242 and 244 to the cold plates 222 and 224. The coolant is circulated through the cold plates 222 and 224 to transfer heat from the heat generating components.

Similarly, the return manifold block 238 has two connectors 250 that are connected to one end of flexible tubes 252 and 254. The other end of flexible tubes 252 and 254 are connected to the cold plates 222 and 224 respectively, and return heated coolant circulated through the cold plates 222 and 224. The flexible tubes 242, 244, 252, and 254 in this example are flexible vacuum flexible tubes manufactured by DTI.

The manifold 230 thus includes the supply manifold block 236 that delivers coolant at a first temperature, and the return manifold block 238 that receives returned coolant at a second temperature that is higher than the first temperature. The manifold 230 is fluidly connected an external heat exchange system such as a fan wall and radiator to cool the heated coolant to return coolant at the first temperature. Each of the cold plates 222 and 224 thus may be fluidly connected to the manifold blocks 236 and 238 via the flexible tubes 242, 244, 252, and 254 to create fluid circuits between the manifold blocks 236 and 238. The fluidic circuit may also include only a single cold plate or more than two cold plates that are fluidly coupled to each other. Any number of fluid circuits and corresponding cold plates may be supported by the manifold blocks 236 and 238 by increasing the number of connectors and tubes for the manifold blocks 236 and 238.

In this example, the tubes 242, 244, 252, and 254 are routed over an example leak protection structure that is a drip tray 260. The drip tray 260 has a shape to cover the area of the circuit board 210 between the cold plates 222 and 224 and the manifold 230. The drip tray 260 is positioned between the tubes 242, 244, 252, and 254, and the circuit board 210 and may support the tubes 242, 244, 252, and 254. The drip tray 260 thus shields components on the circuit board 210 from any coolant that may leak from any of the tubes 242, 244, 252, and 254. The drip tray 260 includes a trough 262 that collects any leaking coolant that drips on to the drip tray 260. As will be explained, the surfaces of the drip tray 260 are sloped to funnel leaking coolant to the trough 262. The bottom of the trough 262 includes a coolant leak sensor 264 that senses collected coolant.

Figure 3:
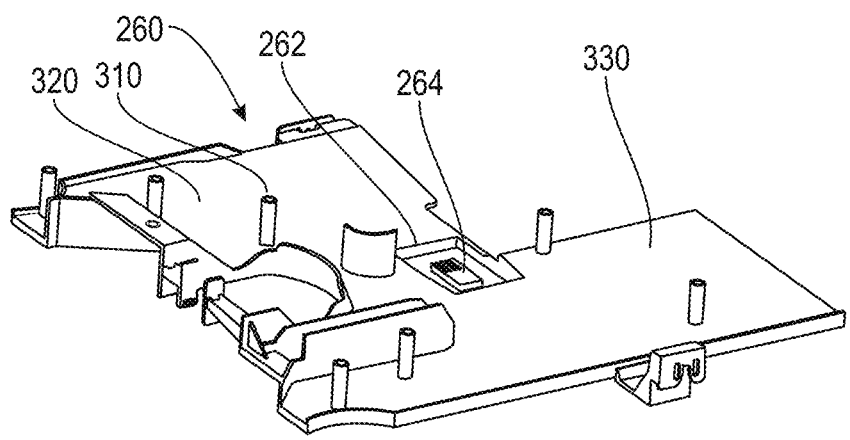
FIG. 3 is a perspective view of an example drip tray with a trough in the leak collection and detection structure, according to certain aspects of the present disclosure.

FIG. 3 shows a perspective view of the leak protection drip tray 260. The drip tray 260 includes a surface coating 310 on an underlying base member 320 having a top surface 330. The surface coating 310 is waterproof material such as Flex seal (FSCL 20), acrylic resin, polyurethane, silicone, or Fuso that is applied to the top surface 330 via spray treatment of the base member 320. The surface coating 310 has hydrophobic properties and creates a capillary phenomenon to overcome any liquid adhesion to the top surface 330. The drip tray 260 has sloped surfaces that slope down from side edges of the top surface 330 and guide any liquid falling on the top surface of the base member 320 toward the trough 262. The coating material of the surface coating 310 is a non-wetting material such that the liquid surface force is greater than the object adhesion force such that liquid does bead on the top surface of the base member 320.

Figure 4A:
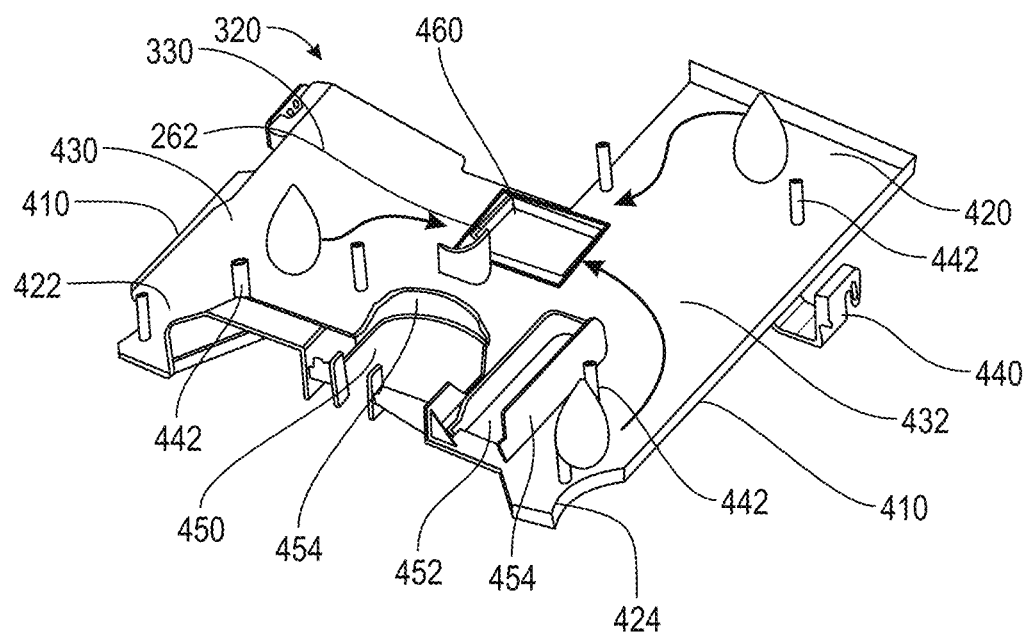
FIG. 4A is a close-up perspective view of the example drip tray prior to applying surface coating according to certain aspects of the present disclosure.
Figure 4B:
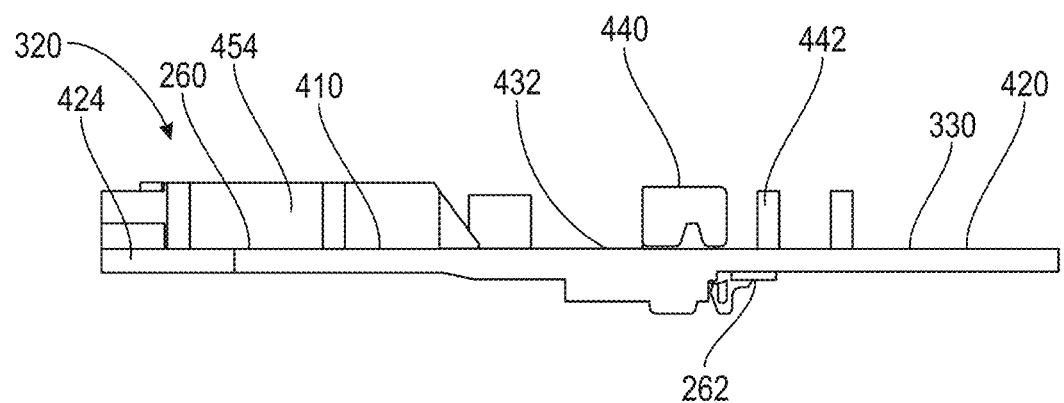
FIG. 4B is a side view of the example drip tray, according to certain aspects of the present disclosure.

In this example, the base member 320 of the drip tray 260 is constructed from plastic or a similar non-conductive material. FIG. 4A shows the drip tray 260 prior the application of the surface coating 310 in FIG. 3. FIG. 4B shows a side view of the drip tray 260. The drip tray 260 has sufficient size to cover the area between the cold plates 222 and 224, and the manifold 230, where the tubes 242, 244, 252, and 254 are routed. The drip tray 260 has a raised barrier 410 along each side edge to contain leaked coolant on the top surface 330. In this example, the drip tray 260 has a manifold section 420 that is proximate contact with the manifold 230. Two opposite cold plate sections 422 and 424 are in proximity of the cold plates 222 and 224. Each of the sections 420, 422, and 424 are oriented at a slope relative to the trough 262. The sections 422 and 424 include raised edges to guide the respective tubes 242 and 252, and 244 and 254. The section 422 is connected to sloped side surface 430. The section 424 and the manifold section 420 are connected via an opposite sloped side surface 432. The manifold section 420 and the side surfaces 430 and 432 include respective side edges that may be unraised, and thus lower than the raised edges of the sections 422 and 424. After the tubes 242 and 252 are connected to the manifold 230 and the cold plate 222, the tubes 242 and 252 rest on the sloped side surface 430 and are routed to the sloped side surface 432. After the tubes 244 and 254 are connected to the manifold 230 and the cold plate 224, the tubes 244 and 254 rest on the sloped side surface 432. A cable guide 440 extends from the sloped side surface 432.

Thus, the sloped orientation of the sections 420, 422, and 424 and the side surfaces 430 and 432 directs any coolant toward the trough 262. The sloped surfaces that compose the top surface 330 on all sides of the trough 262 each slope down from the side edges of the top surface 330 and cause any leaking coolant to flow to the lower position of the trough 262. Thus, all leaked coolant from the tubes 242, 244, 252, and 254 are collected in the trough 262. The top surface 330 of the drip tray 260 includes a series of supports 442 that extend from the top surface 330. In this example, the drip tray 260 includes an aperture 450 that allows the drip tray 260 to fit over extended components mounted on the circuit board 210. Another aperture 452 is formed that allows the drip tray 260 to fit over other components of the circuit board 210. Both of the apertures 450 and 452 are surrounded by a series of relatively high vertical plates 454 to prevent coolant from flowing into the apertures 450 and 452, as well as guiding the position of the tubes 242, 244, 252, and 254.

The bottom of the trough 262 is coated with a porous material layer 460 such as a PVC sponge. The porous material layer 460 is positioned over the sensor 264 in the trough 262. The porous material layer 460 is generally hydrophilic and collects and holds liquid in the trough 262. The porous material layer 460 uses capillary action-infiltration to collect liquid and allow the liquid to flow through the porous material layer 460 to trigger the sensor 264. In this example, the porous material layer 460 is such that liquid surface tension is less than object adhesion and thus coolant is absorbed by the porous material layer 460.

Thus, due to the surface coating 310 and the sloped orientation of the top surface 330, leaking liquid coolant from the tubes contacting the top surface 330 is directed toward the trough 262. Leaked coolant is therefore collected in the trough 262. The porous material layer 460 absorbs the liquid coolant and through capillary action-infiltration, the collected coolant triggers the sensor 264.

Figure 5:
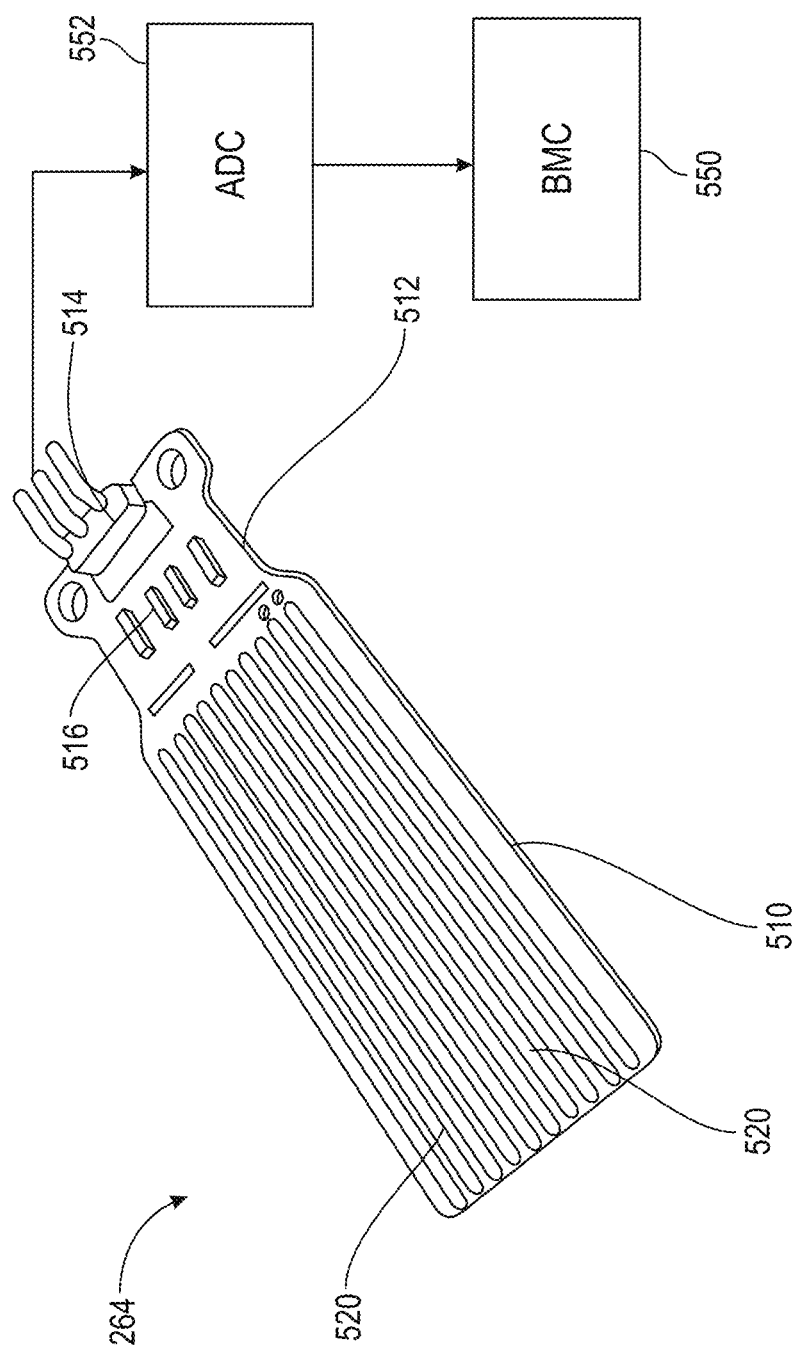
FIG. 5 is a perspective view of a leak sensor for the example drip tray, according to certain aspects of the present disclosure.

FIG. 5 is a close-up perspective view of the sensor 264. The sensor 264 includes a main board 510 with a support arm 512. The support arm 512 has a three pin connector 514 that is coupled to signal filtering circuits 516. The signals on the connector 514 allows resistance from the sensor 264 to be measured. A series of exposed traces 520 are formed on the main board 510. The traces 520 are alternating ground and sensor traces. The sensor traces have a weak pull up resistance value such as 1 MΩ. Water that contacts the ground and sensor traces causes a short circuit between them and thus changes the resistance value.

As shown in FIG. 2, the sensor 264 is mounted on the bottom surface of the trough 262. When any coolant leaks, it runs over the sloped surfaces of the top surface 330 to the trough 262. The leaked coolant is absorbed by the porous material layer 460 and runs down to the sensor 264. The moisture from coolant leaks changes the resistance between the ground and sensor traces 520 and changes the output of the sensor 264.

The output of the sensor 264 may be coupled to a controller such as a baseboard management controller (BMC) 550 via an analog to digital converter (ADC) 552 that may be installed on the circuit board 210 in FIG. 2. The BMC 550 may provide an alert when leaking coolant is detected by the sensor 264. The alert may be lighting an external LED and/or sending a notice to a remote administration station. In this example, the ADC 552 converts the measured resistance between sensor wires into a value that the BMC 550 can read.

The example coolant leakage containment system detects and contains coolant leakage through the combination of mechanical design features and the centralized sensor 264 in the trough 262. The structure of the trough 262 combined with the porous material 460 causes capillary action in the trough 262 that is physical action that can reduce failure rate on the leakage detection and collection system since the leaking coolant is collecting centrally in the trough 262 for the sensor 264. The sensor 264 in the trough 262 reduces the number of sensors required to detect a coolant leak and does not require a long and relatively costly sensor cable. Further, the sensor 264 is more reliable than cable type sensors. The example drip tray 260 can collect liquid more efficiently and avoids damage to other components in the system when coolant leaks.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above-described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A structure for protecting an electronic component from leaking coolant from a liquid cooling system, the liquid cooling system having a manifold collecting and supplying coolant to a cold plate via inlet and outlet tubes, wherein the cold plate is mounted over a heat-generating component on a circuit board, the structure comprising:

a drip tray having a top surface and a length approximately a distance between the manifold and the cold plate, the drip tray including a trough under the top surface for collection of the leaking coolant and a plurality of sloped surfaces that each slope down from edges of the top surface and cause the leaking coolant from the liquid cooling system in contact with the drip tray to flow toward the trough, the drip tray being insertable between the circuit board and the inlet and outlet tubes, and the edges of the top surface comprising a lower edge and a higher edge raised higher than the lower edge, wherein one sloped surface of the plurality of sloped surfaces slopes down from the lower edge, and another sloped surface of the plurality of sloped surfaces slopes down from the higher edge; and a coolant leak sensor including a ground trace and a sensor trace on a bottom surface of the trough, wherein collected leaking coolant causes a short circuit between the ground trace and sensor trace.

2. The structure of claim 1, further comprising a porous layer positioned over the coolant leak sensor in the trough to collect the leaking coolant and allow the leaking coolant to flow through the porous layer to the coolant leak sensor.

3. The structure of claim 1, further comprising a hydrophobic coating applied over the top surface of the drip tray.

4. The structure of claim 1, wherein the heat-generating component is a processor chip mounted on the circuit board.

5. The structure of claim 4, wherein the processor chip is one of a graphic processing unit (GPU) chip or a central processing unit (CPU) chip.

6. The structure of claim 1, wherein the edges of the top surface include barriers to prevent flow of the leaking coolant from the liquid cooling system to the circuit board.

7. The structure of claim 1, wherein the drip tray includes a plastic base member.

8. The structure of claim 1, wherein the circuit board includes another cold plate fluidly coupled to the manifold, wherein the drip tray is interposed between the manifold and the another cold plate.

9. A computer device comprising:
a circuit board;
a heat-generating component mounted on the circuit board;
a manifold supplying and collecting coolant;
a cold plate having a bottom contact surface to thermally contact the heat-generating component;
a supply tube fluidly connected to the cold plate to supply coolant from the manifold;
a collection tube fluidly connected to the cold plate and the manifold to collect coolant from the cold plate;
a drip tray inserted between the cold plate and the manifold, the drip tray having sloped surfaces that each slope down from edges to funnel leaked coolant to a trough, the drip tray being suspended between the circuit board and the supply and collection tubes, and the edges of the sloped surfaces of the drip tray comprising a lower edge and a higher edge raised higher than the lower edge, wherein one sloped surface of the sloped surfaces of the drip tray slopes down from the lower edge, and another sloped surface of the sloped surfaces of the drip tray slopes down from the higher edge; and
a coolant leak sensor including a ground trace and a sensor trace on a bottom surface of the trough, wherein collected leaking coolant causes a short circuit between the ground trace and sensor trace.

10. The computer device of claim 9, further comprising a porous layer positioned over the coolant leak sensor in the trough to collect the leaked coolant and allow the leaking coolant to flow through the porous layer to the coolant leak sensor.

11. The computer device of claim 9, wherein the drip tray has a top surface over which a hydrophobic coating is applied.

12. The computer device of claim 9, wherein the heat-generating component is a processor chip.

13. The computer device of claim 12, wherein the processor chip is one of a graphic processing unit (GPU) chip or a central processing unit (CPU) chip.

14. The computer device of claim 9, wherein the edges of the sloped surfaces of the drip tray include barriers to prevent flow of the leaked coolant to the circuit board.

15. The computer device of claim 9, wherein the drip tray includes a plastic base member.

16. The computer device of claim 9, further comprising another cold plate fluidly coupled to the manifold, wherein the drip tray is interposed between the manifold and the another cold plate.

* * * * *